(12) United States Patent
Islam

(10) Patent No.: US 6,954,084 B2
(45) Date of Patent: Oct. 11, 2005

(54) LOGIC CIRCUITS USING POLYCRYSTALLINE SEMICONDUCTOR THIN FILM TRANSISTORS

(75) Inventor: Mujahid Islam, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 68 days.

(21) Appl. No.: 10/359,101

(22) Filed: Feb. 6, 2003

(65) Prior Publication Data

US 2003/0151426 A1 Aug. 14, 2003

(30) Foreign Application Priority Data

Feb. 11, 2002 (GB) .............................................. 0203194
Feb. 11, 2002 (GB) .............................................. 0203195

(51) Int. Cl.[7] .......................... G06F 7/38; H03K 19/173
(52) U.S. Cl. .............................. 326/37; 326/38; 326/39; 326/40; 326/41; 326/47
(58) Field of Search .............................. 326/37–47, 93, 326/96, 97, 121

(56) References Cited

U.S. PATENT DOCUMENTS

| | | | |
|---|---|---|---|
| 5,013,939 A | * | 5/1991 | Satoh ........................... 326/44 |
| 5,841,298 A | | 11/1998 | Huang |
| 6,169,422 B1 | | 1/2001 | Harris et al. |
| 6,211,704 B1 | * | 4/2001 | Kong .......................... 326/121 |
| 6,590,424 B2 | * | 7/2003 | Singh et al. .................. 326/93 |
| 6,707,317 B2 | * | 3/2004 | Ebergen et al. ............... 326/95 |

OTHER PUBLICATIONS

Payne, "Asynchronous FPGA architectures", IEE Proc.–Comput Digit Tech. vol. 143, No.5., pp. 282–286, 1996.

* cited by examiner

Primary Examiner—Michael Tokar
Assistant Examiner—Khai Nguyen
(74) Attorney, Agent, or Firm—Oliff & Berridge, PLC

(57) ABSTRACT

A large scale integrated (LSI) or a very large scale integrated (VLSI) logic circuit, such as a fully programmable gate array (FPGA), comprises a plurality of polysilicon thin film transistors TFTs. The circuit, which may include a delay circuit, is asynchronous and does not comprise a clock. Thus, operations to be performed by the TFTs need not be performed within a single clock period—rather the operation of each stage of TFTs in the circuit is dependent on receiving a signal either from an input to the circuit or from a preceding stage in the circuit. Problems with variations in the threshold voltage between the TFTs are therefore avoided.

25 Claims, 11 Drawing Sheets

LOGIC CIRCUITS USING POLYCRYSTALLINE SEMICONDUCTOR THIN FILM TRANSISTORS

The present invention relates to digital logic circuits using thin film transistors (TFTs) formed using a polycrystalline semiconductor film, such as polysilicon TFTs in which the film is polycrystalline silicon.

Polysilicon TFTs are well known and the structure of a conventional N-type TFT 10 will be explained with reference to FIG. 1.

As illustrated in FIG. 1, a bedding protective film 51 made of a silicon oxide film is formed on a surface of a substrate 50. On the surface of this bedding protective film 51, a polycrystalline semiconductor film 100 is formed that is patterned into island forms. On the surface of the semiconductor film 100, a gate insulating film 12 is formed, and a gate electrode 14 is formed on the surface of this gate insulating film 12. In the semiconductor film 100, a channel region 15 is formed at a region facing the gate electrode 14 through the gate insulating film 12. At the sides of this channel region 15, a high concentration source region 16 and a high concentration drain region 17 are formed in a self-aligned condition relative to the gate electrode 14. To the high concentration source region 16 and high concentration drain region 17, a source electrode 41 and a drain electrode 42 are respectively electrically connected through contact holes in an interlayer insulating film 52.

Such polysilicon TFTs have an advantage over field effect transistors (FETs) formed with a single crystal semiconductor, such as MOS transistors, in that they can be inexpensively produced since the constraints of producing a satisfactory single crystal silicon substrate are avoided. The transistors can be fabricated on any suitable insulating substrate, such as glass sheet. It follows that the size constraints necessitated by the production of a single crystal are obviated, so that large numbers of TFTs can be produced using a single polysilicon film fabricated on a single inexpensive insulating substrate.

However, polysilicon TFTs have the significant problem that they have widely varying threshold voltages, even when manufactured in the same batch and using a common polysilicon film. The threshold voltage is effectively the voltage applied to the gate electrode 14 at which current can flow through the channel region 15 of the TFT and so determines the ON-state of the TFT. This threshold voltage is in turn determined by the semiconductor film material.

In integrated circuits comprised of single crystal silicon FETs, the single crystal structure is substantially the same for all of the FETs and, consequently, FETs of the same construction will have substantially the same threshold voltage. This effect can be further improved, as required, by the closer proximity of the single crystal FETs to each other on the integrated circuit.

In contrast, in polysilicon TFTs it is difficult to guarantee continuity of individual crystal sizes in the polysilicon film. Furthermore, there are also variations in substrate purity. Thus, the polysilicon film material varies between TFTs, even when the TFTs are formed using the same polysilicon film. This variation in substrate purity, and more particularly in the number of grain boundaries of the crystals in the polysilicon film, affects the threshold voltage, no matter how close the mutual proximity of the polysilicon TFTs on the integrated circuit. Accordingly, threshold voltage varies considerably between polysilicon TFTs, even when using adjacent transistors on a common substrate. Polysilicon TFTs also show other parameter variations, such as saturation current variations, for similar reasons. As a consequence of these parameter variations, there have been considerable problems in implementing digital logic circuits and, in particular, large scale integrated (LSI) or very large scale integrated (VLSI) digital circuits, such as FPGAs, using polysilicon TFTs and this has inhibited the adoption of such transistors for many digital circuit applications. The use of TFTs for FPGAs has not, therefore, been proposed previously.

A field programmable gate array (FPGA) is one type of LSI digital circuit. FPGAs are known in the art and comprise arrays of logic blocks which can be linked together to form complex logic implementations. Each logic block may be made up of a number of gates or transistors, known as a macro cell which has a specified or programmed logic function. The individual macro cells are connected together to implement the logic function of the FPGA.

Moreover, LSI digital circuits, including FPGAs, are conventionally designed to have synchronous logic. In such synchronous logic circuits, the timing of all switching operations performed by the circuit transistors is controlled by clock pulses generated by a master clock. Thus, synchronous logic circuits operate on a fixed cycle operation in which a fixed time is assigned in advance to each operation to be performed. Because all of the transistors are clocked by the master clock, all operations to be performed by the transistors of the circuit must be performed within one clock period. However, the variation in threshold voltage and other parameters between polysilicon TFTs leads to a variation in the logic delay of such polysilicon TFT circuits. As a consequence, it is difficult to guarantee that each operation to be performed by the polysilicon TFTs, if polysilicon TFTs are used in conventional synchronous digital logic circuits, will occur during one clock period and hence that the circuit will function to design requirements. This problem is further compounded in LSI digital circuits comprising polysilicon TFTs, since the large number of polysilicon TFTs necessarily required leads to an even greater variation in logic delay for the circuit. This problem would be especially prevalent in FPGAs, in which the large number of polysilicon TFTs required would lead to an even great variation in logic delay between the TFTs.

In contrast, since single crystal FETs are formed using a single crystal as the substrate, the variation in threshold voltage and other parameters between single crystal FETs is considerably smaller, in comparison to TFTs, and hence the variation in logic delay is correspondingly reduced. Thus, the implementation of functional digital circuits has been considered to be significantly eased by using ICs comprised of single crystal FETs. However, as discussed above, the use of a single crystal poses problems in that it is not at present possible to manufacture LSI circuits using single crystals to the desired large size. It follows therefore that the single crystal solution is restricting the size of the circuits which can be produced. Single crystal FETs are also more expensive to manufacture than polysilicon TFTs, since growth of the single crystal requires different manufacturing conditions and greater accuracy. This can become of significant importance in VLSI circuits where several million transistor devices may be necessary to carry out the circuit function. Furthermore, because the TFTs can be fabricated on an insulating substrate rather than on a semiconductor substrate, the bulk capacitance of the transistor devices is reduced, in comparison to MOS transistors, and hence the operating speed of the transistor devices can be increased. Again, this is a desirable feature for VLSI logic circuits, and in particular for FPGAs, as the circuits can then be operated at a higher speed, reducing processing time.

Asynchronous logic circuits, which are not clocked, are known. However, very few LSI circuits have been designed which use asynchronous techniques. This is because synchronous logic has the general advantage that fewer and simpler circuits are required to implement it, which conflicts to a lesser degree with the size constraints imposed by the restricted size of the single crystal substrates. Thus, synchronous logic has been commonly adopted for logic circuits. Moreover, because synchronous logic requires fewer and simpler circuits, it has been possible to implement accurate logic using single crystal FETs. However, there is an increasing need for digital logic circuits to carry out increasingly complex tasks which means that the circuits are becoming more complex, which in turn means that a larger number of transistors are required to complete the logic operations. A methodology which overcomes the size constraints presented by the use of single crystal MOS circuits, such as may be provided by the use of TFTs, is seen therefore as being particularly advantageous. However, for the reasons outlined above, the use of polysilicon TFTs in synchronous logic LSI digital circuits has been considered unworkable. Hence, the use of polysilicon TFTs and the adoption of asynchronous methodology for LSI digital circuits, such as FPGAs, is hitherto unknown.

According to a first aspect of the present invention, there is provided a polycrystalline semiconductor thin film transistor asynchronous logic circuit comprising an array of logic blocks including a first logic block for performing a logic operation and for providing logic output signals to a second logic block, wherein the second logic block is arranged not to commence its logic operation until the first logic block has completed its logic operation.

Preferably, the array of logic blocks is configured to provide a fully programmable gate array.

In a preferred embodiment, the asynchronous logic circuit is provided with connections configured as horizontal and vertical connections at intersections of horizontal and vertical routing channels coupling between the logic blocks of the FPGA, the horizontal connectors comprising transmission gates arranged such that, at a horizontal connector, each horizontal routing channel can be selectively coupled to a respective vertical routing channel at the said horizontal connector but not to the other vertical routing channels at the said connector, and such that, at a vertical connector, each vertical routing channel can be selectively coupled to a respective horizontal routing channel at the said vertical connector but not to the other horizontal routing channels at the said vertical connector.

Most advantageously, the horizontal and vertical connectors are arranged such that in the horizontal and vertical directions of the routing channels of the FPGA, horizontal connectors are alternately disposed with respect to vertical connectors whereby a connection between the horizontal connectors is made through at least one vertical connector, and a connection between two vertical connectors is made through at least one horizontal connector.

According to a second aspect of the present invention, there is provided a method of performing asynchronous logic comprising providing an asynchronous logic circuit of polycrystalline semiconductor thin film transistors arranged as an array of logic blocks including a first logic block performing a logic operation and providing logic output signals to a second logic block and arranging the second logic block not to commence its logic operation until the first logic block has completed its logic operation.

In a preferred embodiment, the method comprises providing the array of logic blocks as a fully programmable gate array (FPGA).

Advantageously, the method comprises configuring the connections as horizontal and vertical connectors at intersections of horizontal and vertical routing channels for coupling between the logic blocks of the FPGA, and providing the horizontal connectors with transmission gates arranged such that, at a horizontal connector, each horizontal routing channel can be selectively coupled to a respective vertical routing channel at the said horizontal connector but not to the other vertical routing channels at the said connector and such that, at a vertical connector, each vertical routing channel can be selectively coupled to a respective horizontal routing channel at the said vertical connector but not to the other horizontal routing channels at the said vertical connector.

Most advantageously, the method comprises arranging the horizontal and vertical connectors such that, in the horizontal and vertical directions of the routing channels of the FPGA, horizontal connectors are alternately disposed with respect to vertical connectors whereby a connection between two horizontal connectors is made through at least one vertical connector, and a connection between two vertical connectors is made through at least one horizontal connector.

Embodiments of the present invention will now be described by way of further example only and with reference to the accompanying drawings, in which.

Figure 1:
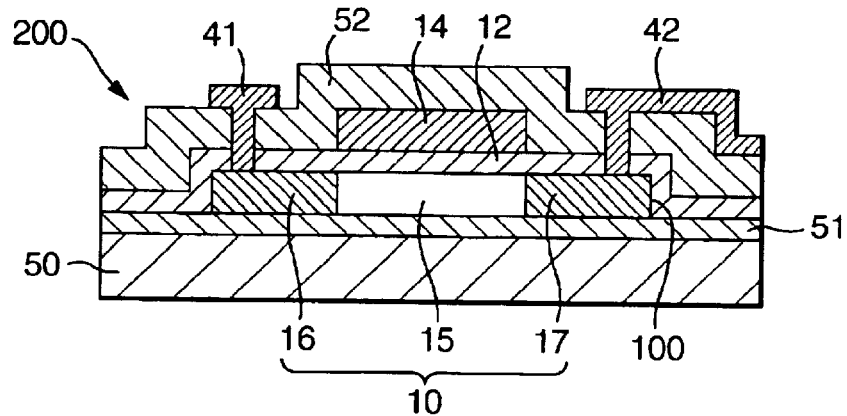
FIG. 1 is a schematic cross-sectional view of a conventional polysilicon thin film transistor.
Figure 2:
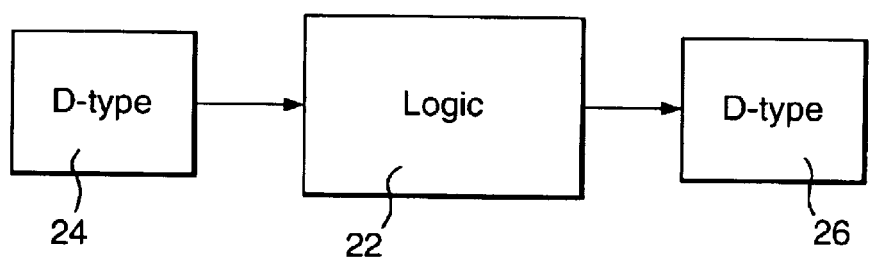
FIG. 2 is a functional schematic diagram of a logic circuit.
Figure 3:
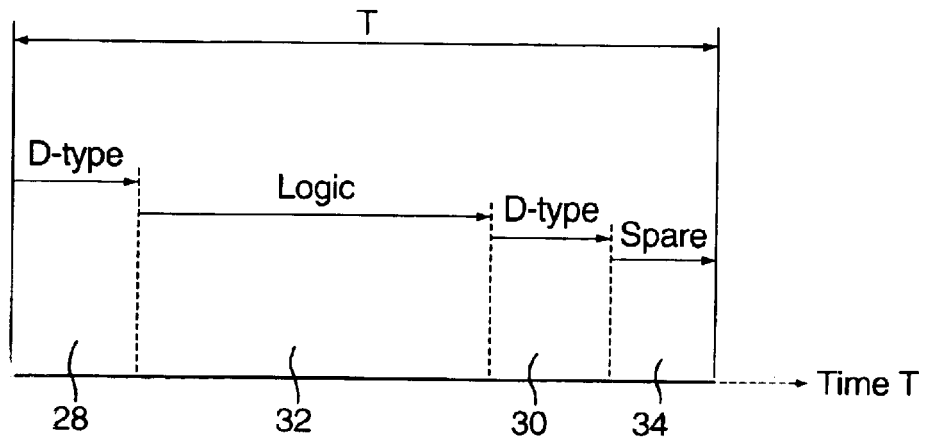
FIG. 3 is a timing diagram showing the clock period used for the circuit illustrated in FIG. 2.

FIG. 2 illustrates schematically a typical LSI digital circuit 20, which is operated using synchronous methodology. Such a circuit may, typically, be incorporated into an FPGA. The digital circuit comprises a logic circuit 22 coupled in series between two D-type flip flop circuits 24 and 26. The clock period required for the circuit to function can be determined with reasonable accuracy when single crystal transistors are used because the switching delays associated with each transistor, being fabricated on a single crystal substrate, are relatively constant and, therefore, quantifiable. The clock period T is therefore usually allocated so as to equal the delay 28 of the flip flop circuit 24, the set up time 30 for the flip flop 26, the delay 32 of the logic circuit, plus a relatively small period of spare time 34. The spare time is allocated to accommodate, for example, the difference in time for a common clock pulse to arrive at both D-type circuits, which might be physically located at opposite ends of the overall integrated circuit. This is commonly referred to in this art as clock skew. Such a clock period is shown in FIG. 3.

If TFT transistors are used to provide the circuit, the variations in delay of the various circuit components become very large and it becomes difficult to allocate a clock period which will guarantee operation of the circuit. If a long clock period is allocated which is predicted to confidently accommodate the critical path circuit delays, the overall circuit operation is likely to become too slow for practical use.

With the present invention, it has been realised that if asynchronous methodology is adopted, and if each stage of the circuit is triggered by the completion of the operation of the preceding stage, then the circuit will be able to complete its required function taking into account the variable operational delays of the various circuit elements. Furthermore, the speed at which the circuit function is completed is determined by the critical path delay of the circuit elements and is not governed by an externally determined and arbitrary clock period, which may be of unnecessarily long duration. This enables LSI digital circuits to be implemented using TFTs and therefore overcomes the size constraints arising from the use of single crystal silicon substrates.

Figure 4:
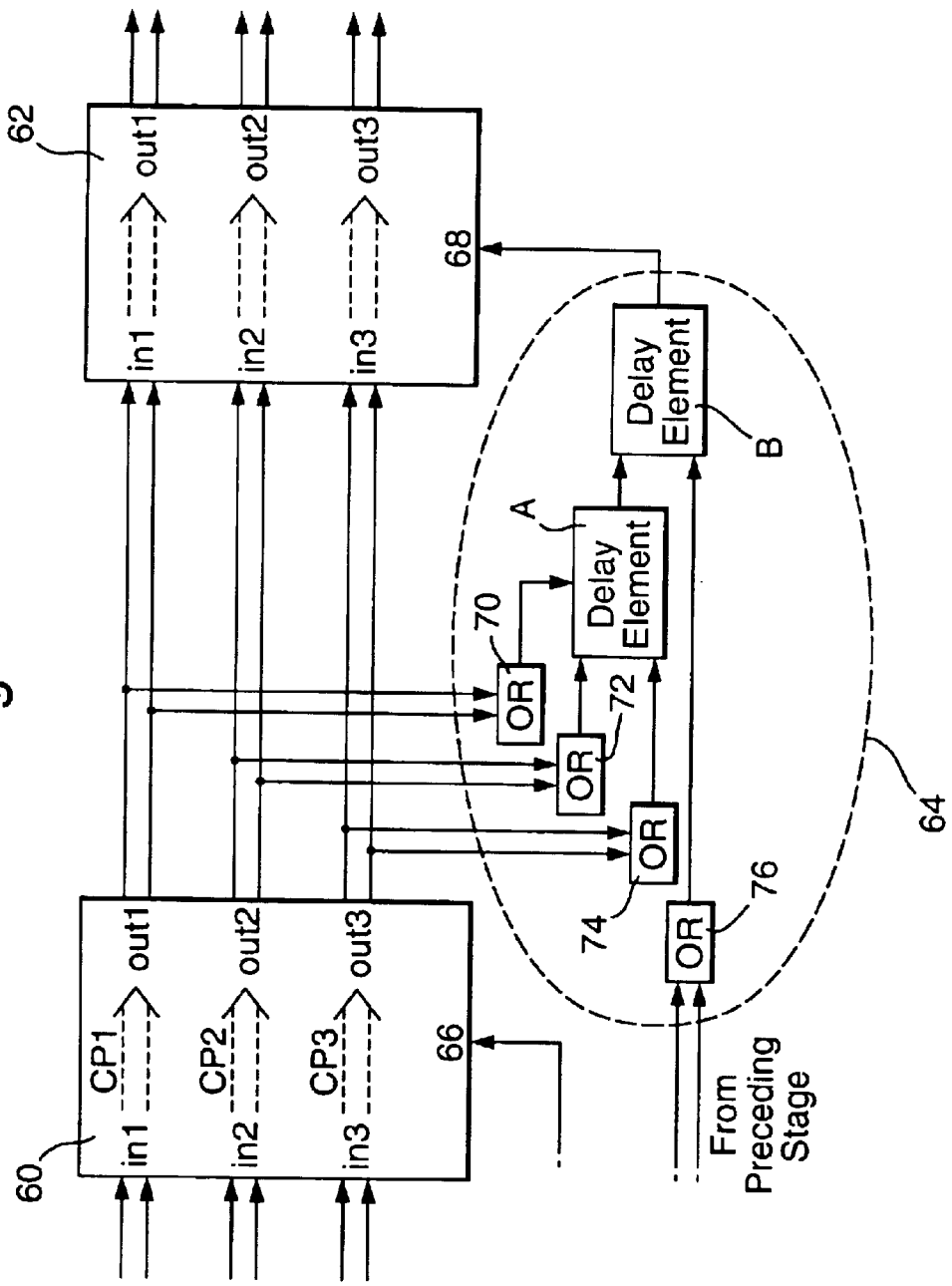
FIG. 4 illustrates schematically a logic block for use in the present invention.

FIG. 4 shows schematically two logic blocks 60 and 62, together with an interface circuit 64 suitable for use in an asynchronous logic circuit according to the present invention.

In the embodiment shown, each logic block 60 and 62 is provided with a respective enable input terminal 66, 68. Each logic block 60, 62 represents a stage in the overall logic circuit and, as will be appreciated by a person familiar with this art, is configured as an array of logic gates to perform a respective logic function. Each of the logic blocks 60, 62 is provided, in the example shown, with three input and three output terminals and the respective output terminals of one logic block are coupled to respective input terminals of the next logic block by two parallel conductive paths because two bit logic is used to communicate between the logic blocks in the logic circuit according to this embodiment of the present invention.

By using two bit logic, the following exemplary encoding may be used to convey information between the various parts of the circuit. The binary combination 00 can be used to indicate that a part of the circuit is not ready; the binary combinations 01 and 10 can be used to respectively represent logic 0 and 1, or vice versa; and the binary combination 11 can be used to indicate a 'not allowed' condition, such as, for example, to show that a fault has occurred in the circuit.

The interface circuit 64 shown in FIG. 4 comprises OR gates 70, 72 and 74, which have their inputs coupled respectively to output terminals out1, out2 and out3 of logic block 60. Hence, the OR gates 70, 72 and 74 receive the binary output signals fed to logic block 62 from logic block 60.

The interface circuit 64 also includes OR gate 76, which is arranged to receive binary output signals from a logic block of a preceding stage (not shown) of the logic circuit. The outputs of OR gates 70, 72 and 74 are fed to a delay element A which is designed such that when the output signals from OR gates 70, 72 and 74 are all logic ZERO, the output signal from delay element A is also logic ZERO, and when the output signals from OR gates 70, 72 and 74 are all logic 1, the output signal from delay element A is also logic 1. However, delay element A is arranged such that its output will only return to logic ZERO when the output signals from OR gates 70, 72 and 74 have all returned to logic ZERO. If the signal at the outputs of any one of OR gates 70, 72 and 74 remains at logic 1, the output of the delay element A will remain at logic 1. From FIG. 4 it can also be seen that the interface circuit 64 also receives output signals from a preceding stage via the OR gate 76. This receipt of binary output signals from a preceding stage is shown by way of example and is intended to indicate that any logic block in the logic circuit, logic block 62 in this example, may require to receive logic signals from not only the immediately preceding stage of the overall circuit but also from another preceding stage of the circuit. However, it should be realised that any logic block of the circuit may require output logic signals from the immediately preceding stage only, in which case the OR gate 76 and delay element B would not be provided.

It can be seen from FIG. 4 that the output of OR gate 76 is coupled to one input of delay element B, which is also arranged to receive on a second input the output signal from delay element A.

Delay element B is configured to operate in a similar manner to delay element A in that the output signal from delay element B will remain at logic ZERO until the outputs from delay element A and OR gate 76 are both logic 1, and the output from delay element B will remain at logic 1 until the output from both delay element A or OR gate 76 return to logic ZERO.

The interface unit 64 functions as follows.

It is assumed that logic block 60 comprises of three respective circuit paths, CP1, CP2, CP3, between input terminals in1 to in3 and output terminal out1 to out3, each path being configured by a series of logic gates fabricated using TFTs. It is also assumed that the circuit path CP1 between terminals in1 and out1 is able to complete its switching operations in less time than the circuit path CP2 between terminals in2 and out2, which in turn is able to complete its switching operations in less time than the circuit path CP3 between terminals in3 and out3.

Circuit path CP1 will therefore complete its logic operations first, and the required logic output, for example logic 1 represented by the code 10, will be passed to OR gate 70. The output of OR gate 70 switches therefore to logic 1 and is passed to one input of delay element A. However, the output from delay element A remains at logic ZERO because the output signals from output terminals out2 and out3 both indicate that circuit paths CP2 and CP3 have not completed their operations by providing the code 00 and hence the output signals from OR gates 72 and 74, which are input to delay element A, remain at logic ZERO.

When circuit paths CP1 and CP2 have also completed their logic operations, the output signals on output terminals out2 and out3 will change from code 00 to, for example, code 01, indicating that the logic output from terminals out2 and out3 are both logic ZERO, the output signals of OR gates 72 and 74 will also switch to logic 1 and the output signal from delay element A will then switch from logic ZERO to logic 1. If it is assumed that the output signal from OR gate 76 is already at logic 1, the signals at both input terminals to delay element B will be logic 1, and the output signal from delay element B will switch from logic ZERO to logic 1.

Delay element B, in switching from logic ZERO to logic 1 at its output, signifies that the logic operations of the immediately preceding stage, namely logic block 60, and the preceding stage (not shown) coupled to OR gate 76 are complete. The output signal from delay element B can then be used as a trigger for logic block 62 to its logic operations.

It can be seen therefore that by using asynchronous logic, the logic operations of the logic circuit as a whole are completed in the shortest time possible, but compensating for the variability in the TFT characteristics, because each stage commences its operations only when it is told that the preceding stages on which it relies have each completed their respective operations.

Figure 5:
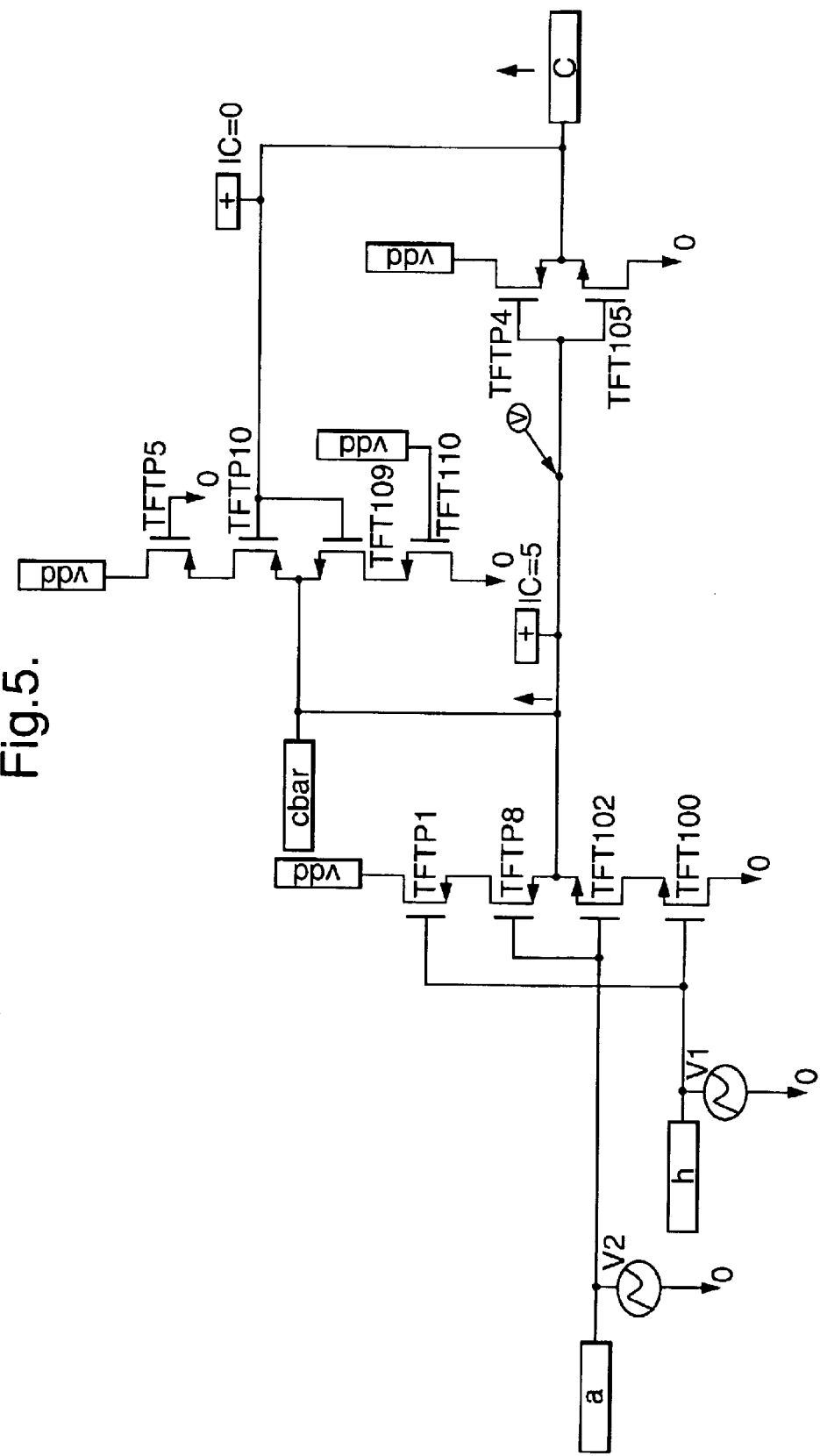
FIG. 5 is a circuit diagram of a delay element for use in a TFT logic circuit in accordance with the present invention.
Figure 6:
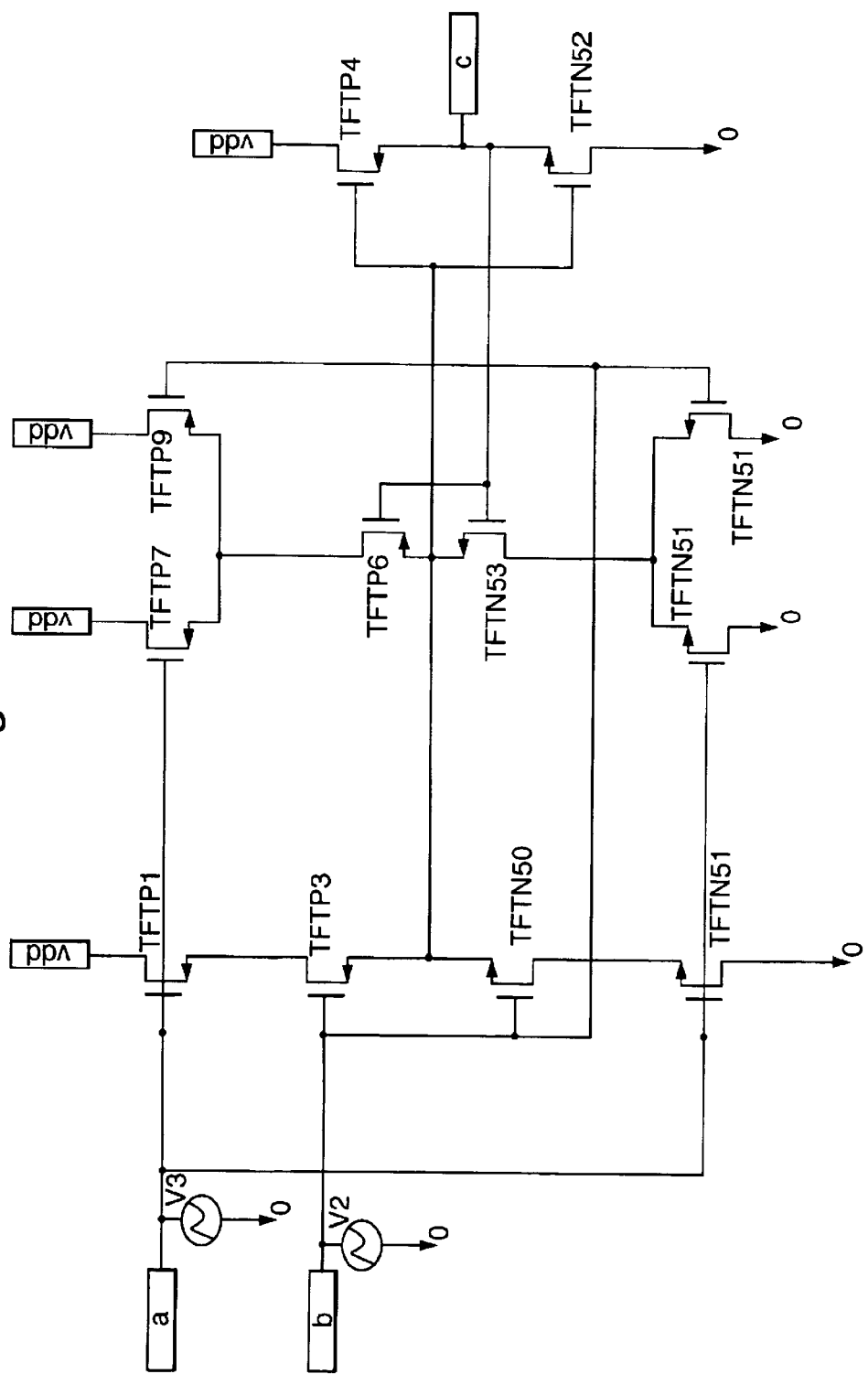
FIG. 6 is a circuit diagram of an alternative embodiment of a delay element for use in a TFT logic circuit in accordance with the present invention.
Figure 7:
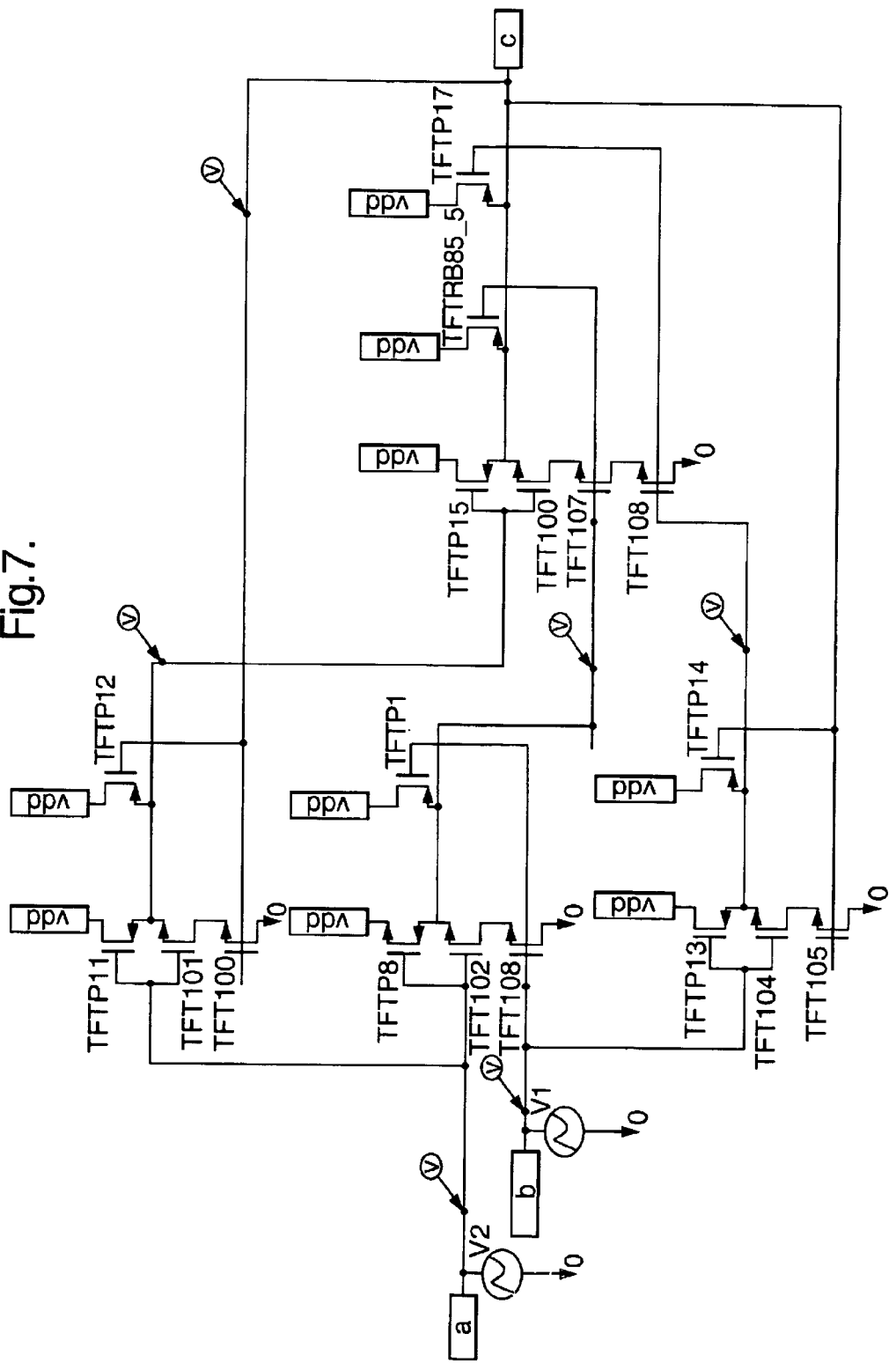
FIG. 7 is a circuit diagram of a third embodiment of a delay element for use in a TFT logic circuit in accordance with the present invention.

FIGS. 5, 6 and 7 all show embodiments of delay circuits suitable for use as delay elements A and B of FIG. 4 fabricated from polysilicon TFTs. No single crystal FETs are used.

Thus, in an asynchronous logic circuit according to the present invention, since the operation of each stage is dependent on receiving a signal from a preceding stage indicating that the preceding stage has completed its operation, the problems of variations in threshold voltage and other parameters associated with the use of polysilicon TFTs are overcome. Thus, the most attractive features of polysilicon TFTs can be fully utilised. These include reduced manufacturing costs and increased yield in due manufacturing process, a lowering of the size constraints presently imposed on LSI and VLSI circuits and the ability to use a larger size of integrated circuit for such circuits. Moreover, the use of TFTs imparts greater reliability to such circuits. Since there is no need to perform each operation in one clock period and to delay the performance of a subsequent operation until the next clock period, an asynchronous logic circuit according to the present invention can have the benefit of a faster processing speed than a conventional logic circuit. In addition, the parts of the circuit run only when needed and not when clocked by the clock pulse. Consequently, an asynchronous TFT logic circuit according to the present invention also exhibits reduced power consumption. This is particularly advantageous where the logic circuit is to be used as part of a portable, hand-held device operating from an integral voltage supply, such as a laptop computer or a mobile phone.

Moreover, the use of polysilicon TFTs need not be confined to the LSI logic circuits themselves but, as is apparent from FIGS. 5, 6 and 7, may also be used to implement the delay elements used in combination with such circuits. Rather, a large number of circuits having widely differing functions and using only polysilicon TFTs can be implemented using asynchronous circuit design methodology.

Figure 8:
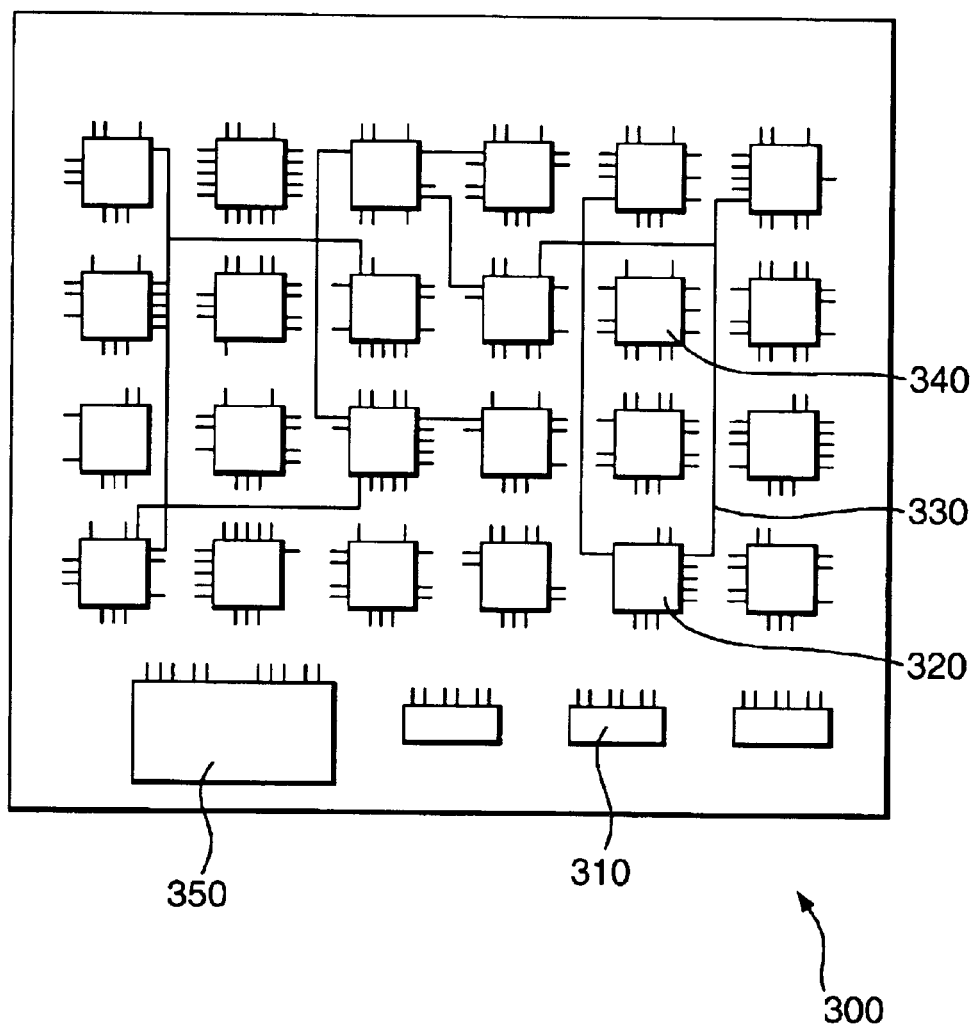
FIG. 8 is a schematic plan view of an FPGA according to the present invention.

An example of a circuit which can be implemented advantageously using asynchronous circuit design methodology is a FPGA. FIG. 8 shows a simplified drawing of the integrated circuit (IC) of a FPGA 300 according to the present invention. The FPGA 300 comprises a static random access memory (SRAM 350, several input/output (I/O) blocks 310 and a plurality of logic blocks 320. Each logic block 320 in turn comprises a plurality of polysilicon TFTs 200. The arrangement and interconnections of the TFTs 200 may be the same for each of the logic blocks 320 or different logic blocks 320 may have different arrangement of TFTs 200. Each of the logic blocks 320 in the FPGA 300 is repeatable and comprises a plurality of inputs and a plurality of outputs. The FPGA 300 further comprises a plurality of routing channels, connecting lines 330, which allow interconnection between the logic blocks 320, and a plurality of programmable interconnects 340. The programmable interconnects 340 comprise programmable switching points to implement the routing of signals through the FPGA 300 between logic blocks 320.

The routing information of the FPGA 300 is held in the SRAM 350, together with the logic held by each logic block 320. Thus, when the FPGA 300 is programmed via the SRAM 350, inputs are selected from the I/O blocks 310 and routed to the appropriate inputs of selected logic blocks 320. Depending on the chosen inputs for the selected logic blocks 320, each logic block 320 will effect a predetermined logic function on the signal or signals input to it. This logic function may be a simple function, such as an AND or an OR function, a delay function or a more complicated function having a large number of variables, for example, it is not uncommon for logic functions to have nine or more variables. The signal or signals output by a logic block 320 may then be routed to one or more further logic blocks 320 for further processing. Eventually, signals are re-routed to the I/O block 310 for output from the FPGA 300. Thus, by selecting the appropriate inputs to the logic blocks 320 and the appropriate routing between the logic blocks 320, by means of the programmable interconnects 340, the logic function of each logic block 320 and hence of the whole FPGA 300 can be programmed using SRAM 350. In other words, the logic function of the FPGA 300 can be built by routing data between different logic blocks 320. Of course, the SRAM 350 and hence the logic function performed by the FPGA 300, can be reprogrammed.

The present invention is not limited to the use of SRAM 350 or any other form of memory for programming the FPGA 300. Alternatively, it would be possible to use programmable read only memory (PROM) for programming the FPGA 300 a single time only; erasable PROM (EPROM); or electrically erasable PROM (EEPROM) instead of SRAM. However, the FPGA memory would be typically programmed out of circuit only and, in the case of PROM, could not be reprogrammed.

A further alternative would be to implement the FPGA 300 of the present invention as a fuse based FPGA, in which each memory cell is provided with a fusible link to earth and information is placed in the memory by applying a pattern of electrical pulses to the array that is strong enough to blow the fuses at locations where open circuits are required. This means that the FPGA cannot subsequently be reprogrammed. However, the consequent disadvantage of the impossibility of reprogramming the memory may be offset for certain applications of these circuits by the reduced size and cost.

Moreover, the connections between the logic blocks 320 may be implemented in a number of ways. The connecting lines 330 may be a number of metal segments with programmable switching point 340 to implement the routing. The connections may be of the single length line type, having a grid of horizontal and vertical lines which intersect at a switch matrix between each logic block 320. Alternatively, the connections may be of the double length line type, in which a grid of horizontal and vertical lines intersects at switch matrices between two logic blocks 320. Further, they may be of the long type, wherein a grid is formed of metal interconnection segments that run the entire length of the array.

Figure 9:
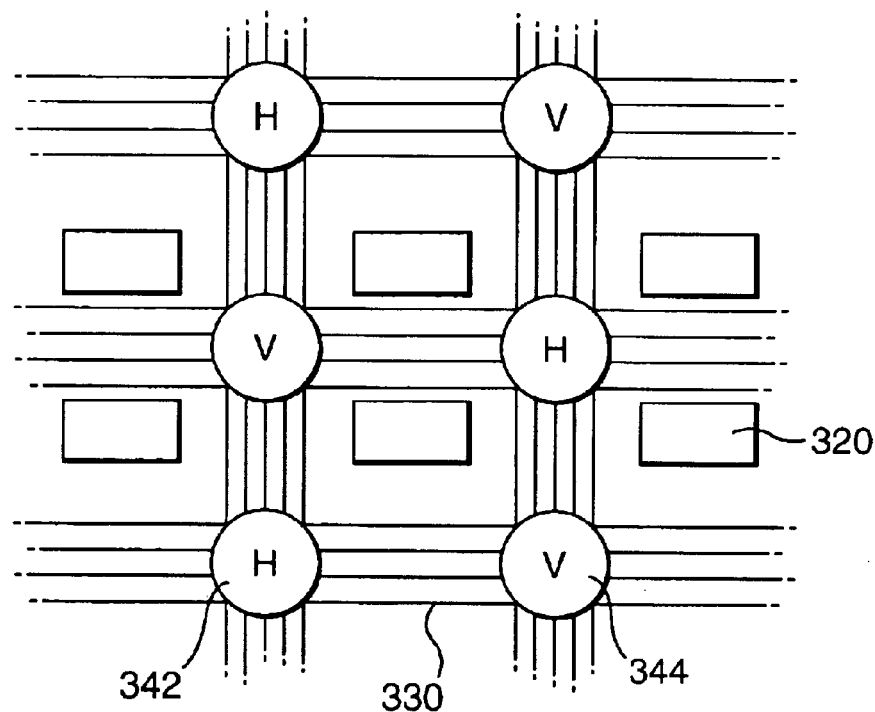
FIG. 9 is a schematic plan view illustrating connections in an FPGA according to the present invention.
Figure 10:
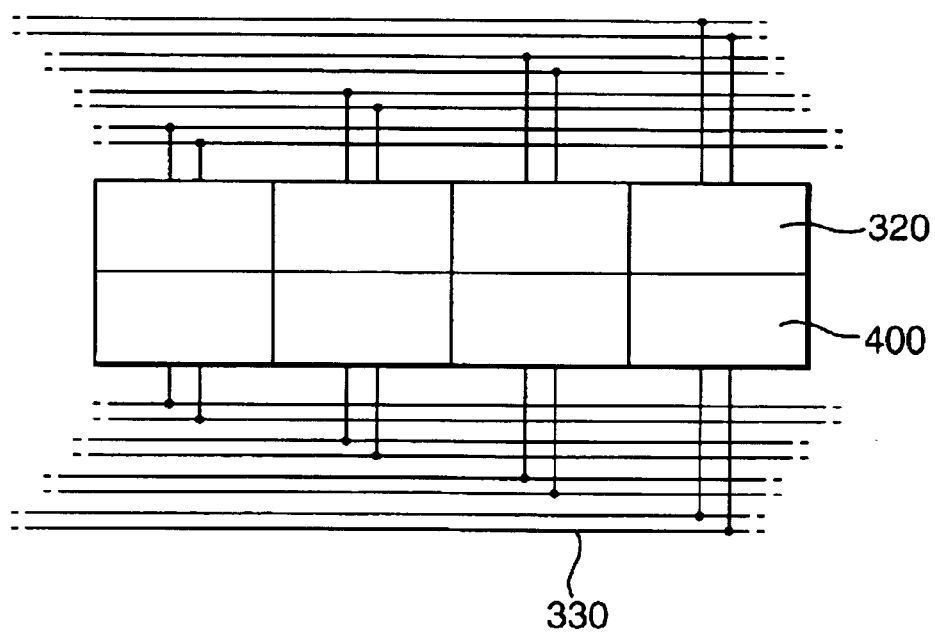
FIG. 10 is a plan view of a group of logic blocks included in an FPGA according to the present invention.

FIG. 9 shows one eagle of an interconnection means, in which metal connecting lines 330 run in parallel with one another in both the horizontal and vertical directions between each logic block 320. A tri-state programmable connector 340 is also provided for each logic block 320, which tri-state connector 340 may be either a horizontal connector 342 or a vertical connector 344. Horizontal and vertical tri-state connectors 342 and 344 are usually provided in equal numbers and, between them, allow connection of a horizontal connecting line with another horizontal connecting line; connection of a vertical connecting line with another vertical connecting line; connection of a horizontal connecting line with a vertical connecting line; or no connection at all between lines. The states of the connectors, and hence the routing of the FPGA 300, are determined by the programmed SRAM 350.

In each of the logic blocks 320, all of the switching operations of the polysilicon TFTs are triggered by a free-running signal so that successive stages within the logic blocks 320 are triggered by the completion of the operation of the preceding stage. In each stage, the output goes high only when all the inputs to that stage go high. Similarly, each logic block 320 is dependent on its operation from a signal either from the I/O blocks 310 or from a preceding logic block 320 in the programmed routing of the FPGA 300. In other words, the FPGA 300 comprises, in essence, separate blocks of logic each connected in series. This being the case, the FPGA 300 need not comprise a clock or clock signal and no matter what the logic delay of each polysilicon TFT, the FPGA 300 will operate satisfactorily.

Each of the TFTs 200 of a single logic block 320 is constructed using the same polysilicon film 100. This has the advantage that the grain boundaries of the polysilicon film 100 are similar for all of the TFTs 200 and hence the variation in threshold voltage and other TFT parameters is minimised within a logic block 320. Preferably, all of the logic blocks 320 are formed using the same polysilicon film 100.

More preferably still, in the asynchronous FPGA 300 of the present invention a plurality of logic blocks 320 is formed so that they lie in close proximity to one another using the same polysilicon film 100. Such a construction is illustrated in FIG. 6, in which eight logic blocks 320 are constructed in close proximity to each other using the same polysilicon film 100 to form a logic block group 400. The close proximity of each of the logic blocks 320 has the advantage that variations in grain boundaries in the polysilicon film (and hence in the parameters of the TFTs 200, such as threshold voltage) between each of the eight logic blocks 320 in the group 400 are minimised. The FPGA 300 of the present invention comprises a plurality of such groups 400 of logic blocks 320. Preferably, all of the groups 400 are formed using the same polysilcon film 100.

Connecting lines 330 and programmable connectors 340 can be arranged in the FPGA 300 accordingly, so that connections can be made to different logic blocks 320 in a group 400 and between different logic blocks 320 within a group 400. Of course, each group 400 in the FPGA 300 can contain fewer or more than eight individual logic blocks 320.

Since the operation of each logic block 320 and of each stage within each logic block 320 is dependent on receiving a signal either from an I/O block 310 or a preceding logic block 320, or both, which indicates that the preceding logic block has completed its operation or that the I/O block is ready to route a further input to the logic block concerned. The problems of variations in threshold voltage and other parameters previously associated with polysilicon TFTs have been overcome by the present invention. Thus, the most attractive features of polysilicon TFTs can be fully utilised. These include reduced manufacturing costs and increased yield in the manufacturing process, a lowering of the size constraints presently imposed on known FPGAs, lower power consumption than FETs and the ability to include a larger number of transistors in an FPGA.

It can be seen therefore that by using asynchronous logic, the logic operations of each logic block and hence the FPGA as a whole are completed in the shortest time possible, but compensating for the variability in the TFT characteristics because each stage of the FPGA only commences its operations when it is told that the preceding stage or stages from which it requires to receive information have each completed their respective operations. This is also the case when a logic block requires to also receive information from an I/O block, as it will not commence its operation until the I/O block is ready to supply the information to the logic block.

An FPGA 300 according to the present invention has a wide variety of applications in industry and is suitable for implementation in any field where logical processing of large amounts of information is required or where a large amount of logical manipulation needs to be performed on the data. An example of such an application is the linking of displays, in particular liquid crystal displays, with data inputs such as is used in an electronic book. Another example is an application requiring a high degree of security and hence large volumes of data that must be processed for encoding or decoding. In addition, the parts of the circuit run only when needed and not when clocked by the clock pulse. Consequently, an asynchronous TFT FPGA according to the present invention also exhibits reduced power consumption. Hand-held portable devices are also therefore particularly suited for implementation using an FPGA of the present invention.

Figure 11:
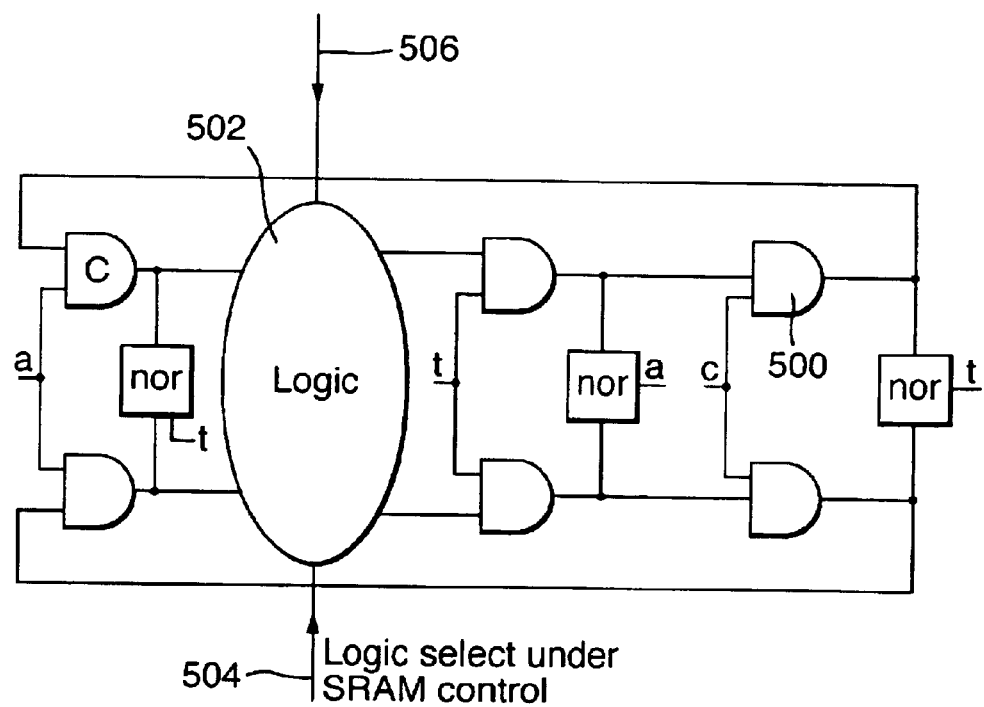
FIG. 11 is a block schematic diagram of a logic block for use in the present invention.

The logic blocks 320 comprise C-elements 500 arranged to form the equivalent of a register, as shown in FIG. 11. The logic within a logic block, which is shown schematically as logic element 502 in FIG. 11, is controlled by instructions from the SRAM 350, shown in FIG. 8, received on input 504. The logic is also arranged to receive further input from the routing channel along input line 506, which is also under the control of the SRAM 350. As described previously, routing of the instructions is achieved via programmable inconnects 340, shown in FIG. 8, which are also under the control of the SRAM 350.

Each routing channel, namely the connecting lines 330 shown in FIG. 8, preferably comprise a pair of dual rail lines to allow the use of the two bit logic protocol used to communicate between the various elements of the FPGA. As shown in FIG. 9, these routing channels are usually arranged in parallel with one another in both the horizontal and vertical directions to facilitate fabrication of the VLSI device. The programmable connectors 340 are therefore arranged as horizontal connectors 342 or vertical connectors 344, as shown in FIG. 9.

Figure 12:
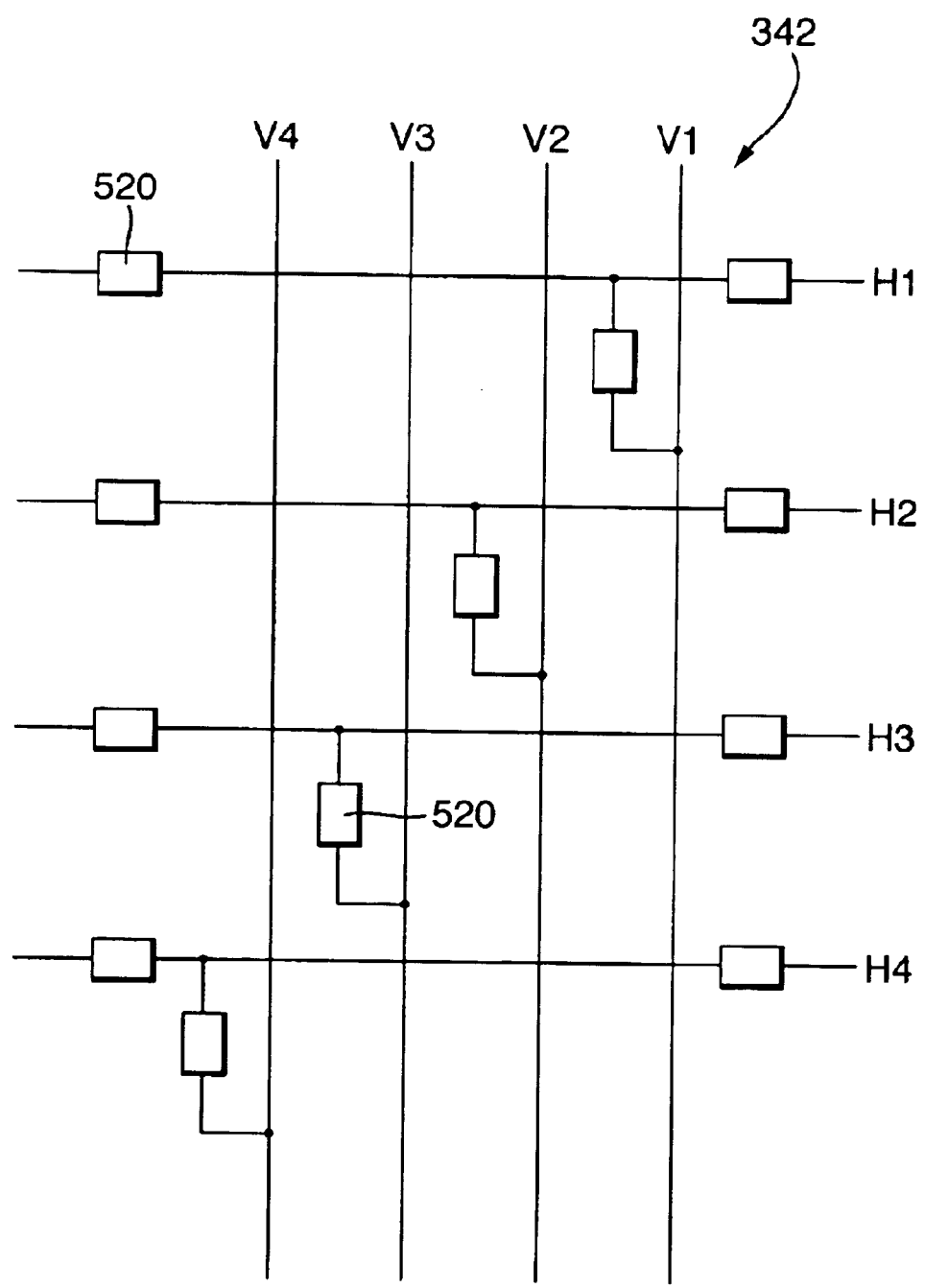
FIG. 12 is a block schematic diagram of a horizontal connector for use in a FPGA according to the present invention.
Figure 13:
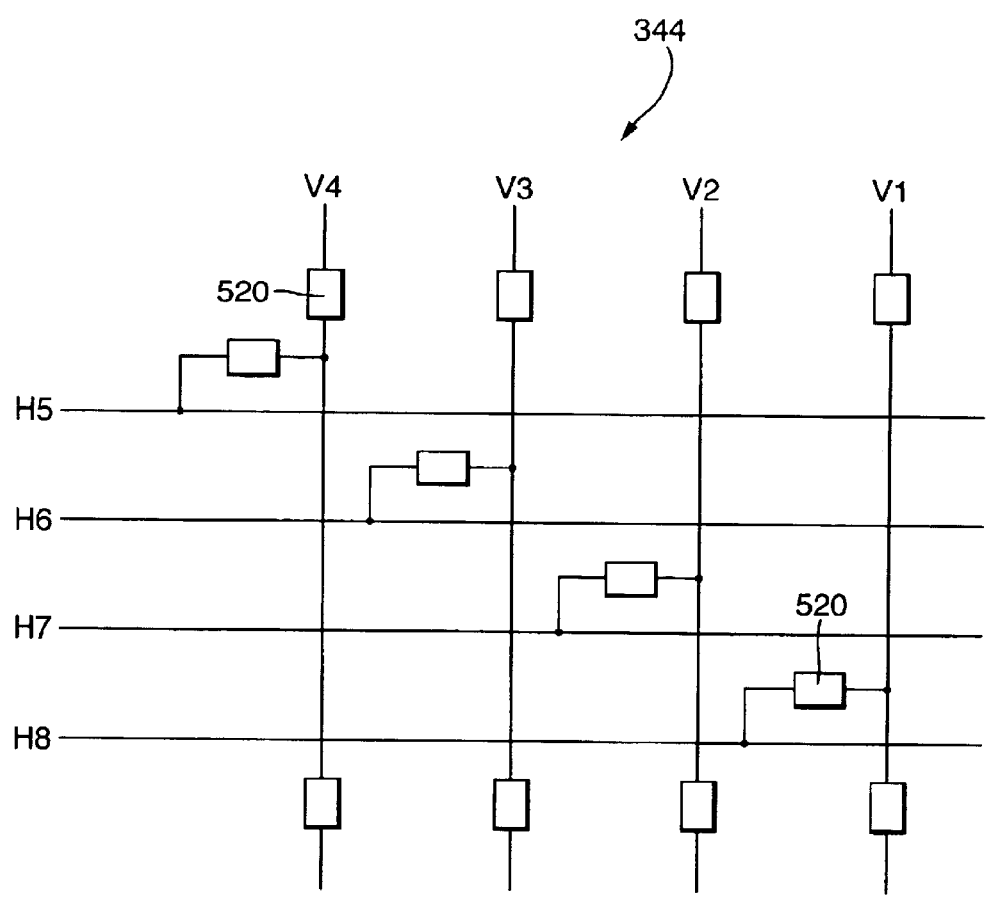
FIG. 13 is a block schematic diagram of a vertical connector for use in a FPGA according to the present invention.

At the intersections of the horizontal and vertical routing channels it is unnecessary to arrange of each routing channel to be capable of connecting to every other routing channel and to arrange for such connections would significantly increase the complexity of the device layout. Access to the horizontal and vertical routing channels, as well as connections from the horizontal to the vertical routing channels, and vice versa, made by a horizontal connector 342, as shown in FIG. 12, or from the vertical to the horizontal routing channels, and vice versa, made by a vertical connector 344 as shown in FIG. 13, are made by transmission gates 520. Hence, in the FPGA according to the present invention, the horizontal and vertical connectors are arranged to alternate in both the horizontal and vertical directions of the device, as shown in FIG. 5.

As shown in FIG. 12, the horizontal connectors 342 are arranged so that horizontal routing channels H1 to H4 are respectively coupled to vertical routing channels V1 to V4 through respective transmission gates. However, it can be seen from FIG. 12 that horizontal routing channel H1 is not coupled to vertical routing channels V2, V3 and V4, channel H2 is not coupled to V1, V3 and V4, channel H3 is not coupled to channels V1, V2 an V4, and channel H4 is not coupled to channels V1, V2 and V3.

Likewise, as shows in FIG. 13, the vertical connectors 344 are arranged so that the vertical routing channels V1 to V4 are respectively coupled to horizontal routing channels H8 to H5 through respective transmission gates 520.

It can be seen from FIGS. 12 and 13 that the horizontal connectors 342 can each be isolated from the horizontal routing channels by transmission gates 520 in the horizontal direction of the array whereas the vertical connectors 344 can each be isolated from the vertical routing channels by transmission gates 520 in the vertical direction of the array. These arrangements of the transmission gates enable both the horizontal and the vertical routing channels to be subdivided and therefore, in effect, selectively controlled in any part of the FPGA.

Figure 14:
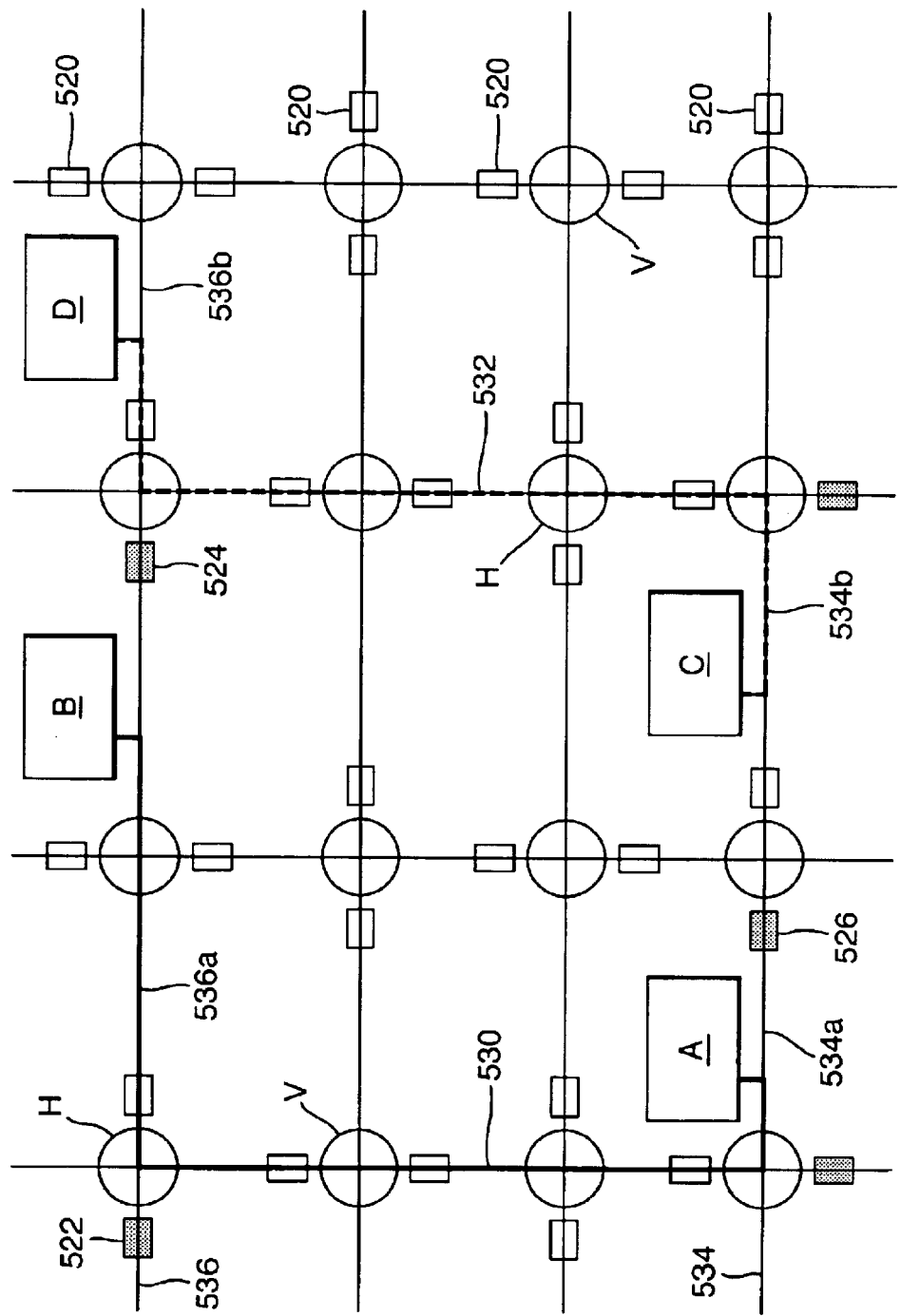
FIG. 14 is a block schematic diagram showing an example of selectively coupled logic blocks in a FPGA.

FIG. 14 shows schematically a part of the FPGA and this part includes four logic blocks A,B,C and D. To perform a logic operation, it is assumed in this figure that logic block A is to be coupled to logic block B, and that logic block C is to be coupled to logic block D, but that the logic blocks A and B are to remain isolated logically from logic blocks C and D.

The horizontal and vertical transmission gates for, respectively, the horizontal and vertical connectors can be seen in FIG. 14. To connect the logic blocks in the above way the transmission gates 522 to 526 are opened. Because there is a connection between the horizontal and vertical routing channels at each of the horizontal and vertical connectors 342 and 344. The logic block A is connected to logic block B, and logic block C is connected to logic block D. However, it is required to maintain logic blocks A and B isolated from logic blocks C and D. This is achieved by the selective opening of transmission gates 522 to 526. In this way logic block A is coupled to logic block B by the routing channel path 530, shown by the bold line in FIG. 14. Likewise, logic block C is connected to logic block D by the routing channel path 532, shown by the bold dotted line in FIG. 14. However, the opening of transmission gate 526 effectively divides horizontal routing channel 534 into two sections, shown as sections 534a and 534b in FIG. 14. Section 534a, which extends to the open transmission gate 526, provides connection to logic block A but is not connected to logic block C. Section 534b provides connection to logic block C but not to logic block A. Likewise opening of transmission gate 524 effectively divides horizontal routing channel 536 into sections 536a and 536b.

It is to be understood that, to assist understanding, each of the routing channels shown in FIGS. 12 to 14 is shown as a single conductor line. However, in practice, each of the routing channels would actually comprise dual conductor lines to allow the use of the two bit logic described above.

The selective operation of the transmission gates allows therefore a single routing channel to be used to provide connectors to a plurality of logic block having their respective input ports coupled to the routing channel concerned whilst allowing the logic blocks to be isolated from each other. Therefore, a single routing channel can be used to contemporaneously feed logic commands to respective logic blocks along individual sections of the routing channel. This arrangement, with the horizontal and vertical connectors configured as shown respectively in FIGS. 12 and 13, enables the logic blocks 320 of the FPGA to be inconnected in the horizontal and vertical directions with a substantial reduction in the complexity at the crossover points of the routing channels. It also enables the horizontal and vertical routing channels to be used in a highly efficient manner, thereby achieving a substantial reduction in the complexity of the overall circuit layout.

The aforegoing description has been given by way of example only and it will be appreciated by a person skilled in the art that modifications can be made without departing from the scope of the present invention. For example, a succeeding stage may sense that a preceding stage has completed its operation by sensing that an output signal from the preceding stages changes from a first level to a second level, such as a high level to a low level, or vice versa.

Additionally, in the embodiments described, a two wire system and two bit logic have been used to convey data and data completion. However, other encoding systems may also be used or this purpose such as 1 of 4 or 3 of 7 encoding.

Furthermore, the logic gates of the interface circuit 64 are shown as OR gates. However, other configurations of logic gates may be used, as will be apparent to a person skilled in this art.

What is claimed is:

1. A logic circuit comprising:
   a first logic block that performs a first operation and that provides first logic output signals;
   a second logic block that receives at least one of the first logic output signals; and
   an interface circuit configured to receive a plurality of the first logic output signals from the first logic block;
   the second logic block receives an indicating signal from the interface circuit that indicates that the first logic block has completed the first operation;
   the second logic block being arranged not to commence a second operation before the second logic block receives the indicating signal, and
   the first logic block and the second logic block being formed of polycrystalline semiconductor thin film transistors.

2. The logic circuit according to claim 1, wherein the interface circuit includes an array of logic gates coupled in series with a delay circuit.

3. The logic circuit according to claim 2,
   wherein the first logic output signals comprise binary signals including at least two bits such that the first logic signals signify at lest one of a logical ONE, a logical ZERO, a not ready condition, and an unacceptable condition for at least one of the first logic block and the second logic block.

4. The circuit according to claim 3,
   wherein the first logic block and the second logic block are interconnected by conductive paths.

5. The logic circuit according to claim 1,
   the interface circuit including an OR gate arranged to receive at least one of the first logic signals.

6. The circuit according to claim 1, the logic circuit including no transistors other than polycrystalline semiconductor thin film transistors.

7. The logic circuit according to claim 1,
   wherein the logic circuit is at least one of a large scale integrated and a very large scale integrated digital logic circuit.

8. The logic circuit according to claim 1,
the first logic block being included in an array of logic blocks, and
the array being configured to provide a fully programmable gate array.

9. The logic circuit according to claim 8, wherein several of said array of logic blocks are arranged in close proximity to one another so as to be formed with a single polycrystalline semiconductor film thereby forming a group.

10. The logic circuit according to claim 9, wherein said fully programmable gate array comprises a plurality of said groups.

11. The logic circuit according to claim 1
wherein a logic function of each of the first logic block and the second logic block is programmable.

12. The logic circuit according to claim 11,
the first logic block and the second logic block being included in an array configured to provide a fully programmable gate array; and
connections with the first logic block and the second block being programmable using an SRAM.

13. The logic circuit according to claim 12, wherein connections included in the array are configured as horizontal and vertical connections at intersections of horizontal and vertical routing channels for coupling between logic blocks of the fully programmable gate array, the horizontal connectors including transmission gates arranged such that, at a horizontal connector, each horizontal routing channel is selectively coupable to a respective vertical routing channel at the said horizontal connector but not to the other vertical routing channels at the said connector, and such that, at a vertical connector, each vertical routing channel is selectively coupable to a respective horizontal routing channel at the said vertical connector but not to the other horizontal routing channels at the said vertical connector.

14. The logic circuit according to claim 13, wherein the horizontal connectors include transmission gates for selectively decoupling the horizontal connectors from the horizontal routing channels and the vertical connectors include transmission gates for selectively decoupling the vertical connectors from the vertical routing channels.

15. The logic circuit according to claim 13, wherein the horizontal and vertical connectors are arranged such that in the horizontal and vertical directions of the routing channels of the fully programmable gate array, horizontal connectors are alternately disposed with respect to vertical connectors whereby a connection between two horizontal connectors is made through at least one vertical connector, and a connection between two vertical connectors is made through at least one horizontal connector.

16. The logic circuit according to claim 13, wherein each said connection comprises a programmable tri-state connector.

17. A logic circuit comprising:
a first logic block that performs a first operation;
a second logic block;
a third logic block; and
an interface circuit configured to receive a plurality of first logic output signals from the first logic block and a plurality of third logic output signals from the third logic block,
the interface circuit generating an indicating signal that indicates the first logic block has completed the first operation,
the second logic block not commencing a second operation before the second logic block receives the indicating signal, and
the indicating signal not being provided to the second logic block before the interface circuit receives the first logic output signals.

18. The logic circuit according to claim 17,
the first logic block, the second logic block, and the third logic block being included in an array of logic blocks,
the array being configured to provide a fully programmable gate array,
the interface circuit receiving second logic output signals from a fourth logic block included in the array, and
the indicating signal not being provided to the second logic block until the interface circuit receives the second logic output signals from the fourth logic block.

19. A logic circuit, comprising:
a first logic block that performs a first operation and that provides first logic output signals; and
a second logic block that receives at least one of the first logic output signals;
wherein the second logic block is arranged not to commence a second operation before the first logic block has completed the first operation;
the first logic block and the second logic block being formed of polycrystalline semiconductor thin film transistors;
the first logic block and the second logic block being included in an array of logic blocks configured to provide a fully programmable gate array; and
the fully programmable gate array including a plurality of interconnected logic blocks having a logic function and including a plurality of polycrystalline semiconductor thin film transistors.

20. A logic circuit comprising:
a first logic block that performs a first operation and that provides logic output signals; and
a second logic block that receives the logic output signals,
the second logic block being arranged not to commence a second operation until a previous operation at a previous block is completed, the first logic block has completed the first operation, and transmission of the logic output signals being performed by using a plurality of bit lines.

21. The logic circuit according to claim 20, wherein:
the second logic block receives an indicating signal that indicates that the first logic block has completed the first operation, and
the second logic block does not commence the second operation until the second logic block receives the indicating signal.

22. The logic circuit according to claim 21, further comprising an interface circuit that receives the logic output signals from the first logic block and generates the indicating signal.

23. A method of performing logic operation, the method comprising:
performing a first operation at a first logic block;
generating logic output signals at the first block;
receiving the logic output signals at a second logic block; and
commencing a second operation at the second logic block after the first operation at the first logic block and a previous operation at a a previous block is completed;
wherein transmission of the logic output signals is performed by using a plurality of bit lines.

24. The method of performing logic operation according to claim 23, further comprising:

receiving an indicating signal that the first logic block has completed the first operation, the receiving being performed by the second to logic block; and commencing the second operation after the second logic block receives the indicating signal.

25. The method of performing logic operation according to claim 24, further comprising receiving the logic output signals from the first logic block and generating the indicating signal, the receiving the logic output signals and the generating being performed at an interface circuit.

* * * * *